(12) United States Patent
Li

(10) Patent No.: US 11,251,180 B2
(45) Date of Patent: Feb. 15, 2022

(54) TRANSISTOR AND METHOD FOR FORMING THE SAME

(71) Applicant: UNITED MICROELECTRONICS CORP., Hsinchu (TW)

(72) Inventor: Shin-Hung Li, Nantou County (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 90 days.

(21) Appl. No.: 16/430,941

(22) Filed: Jun. 4, 2019

(65) Prior Publication Data

US 2020/0388614 A1 Dec. 10, 2020

(51) Int. Cl.
| | | |
|---|---|---|
| *H01L 29/76* | (2006.01) | |
| *H01L 27/088* | (2006.01) | |
| *H01L 29/78* | (2006.01) | |
| *H01L 29/66* | (2006.01) | |
| *H01L 21/311* | (2006.01) | |
| *H01L 21/8234* | (2006.01) | |

(52) U.S. Cl.
CPC ...... *H01L 27/088* (2013.01); *H01L 21/31111* (2013.01); *H01L 21/823468* (2013.01); *H01L 29/66477* (2013.01); *H01L 29/78* (2013.01)

(58) Field of Classification Search
CPC ....... H01L 21/31111; H01L 21/823468; H01L 27/088; H01L 29/66477; H01L 29/78; H01L 21/823412; H01L 29/1037
See application file for complete search history.

(56) References Cited

U.S. PATENT DOCUMENTS

| | | | |
|---|---|---|---|
| 7,687,854 B2 | 3/2010 | Park | |
| 8,093,665 B2 * | 1/2012 | Yang | H01L 29/66636 257/408 |
| 8,809,150 B2 | 8/2014 | Zhang et al. | |
| 9,583,617 B2 | 2/2017 | Hsiao et al. | |
| 2004/0245564 A1 * | 12/2004 | Ogura | H01L 27/1159 257/315 |
| 2006/0286757 A1 | 12/2006 | Power et al. | |
| 2012/0289009 A1 * | 11/2012 | Yeh | H01L 29/66628 438/198 |

* cited by examiner

*Primary Examiner* — Meiya Li
(74) *Attorney, Agent, or Firm* — WPAT, PC

(57) ABSTRACT

A transistor and a method for forming the same are provided. The transistor includes a semiconductor substrate, a gate dielectric layer, a gate electrode, a spacer, and a source/drain. The semiconductor substrate includes a protrusive semiconductor portion protruded from a lower surface of the semiconductor substrate. The gate dielectric layer is on the semiconductor substrate. The gate electrode is on the gate dielectric layer. The spacer is on a sidewall of the gate electrode. An outer surface of the spacer has a concave portion. The source/drain is in the semiconductor substrate.

17 Claims, 9 Drawing Sheets

TRANSISTOR AND METHOD FOR FORMING THE SAME

BACKGROUND

Technical Field

The disclosure relates to a semiconductor device, and particularly relates to a transistor and a method for forming the same.

Description of the Related Art

As technology advances, the semiconductor device is minimized to meet the trend of lighter, thinner, shorter and smaller products. As the size of the semiconductor device is scaled down, the gate thickness becomes less and the spacer width becomes shorter, resulting in high gate-induced drain leakage (GIDL) and severe hot carrier effect.

In the conventional method, the implanting dosage of source/drain extension (SDE) regions is increased to resolve the said issues. However, the sheet resistance and gate-drain overlap capacitance are increased to affect the device performance. Therefore, how to effectively increase the spacer width to alleviate the GIDL and hot carrier effect has drawn high attention in the industry.

SUMMARY

Accordingly, the present invention provides a transistor and a method of forming the same, in which a spacer width of the transistor can be increased, so the gate-induced drain leakage (GIDL) and hot carrier effect can be reduced.

According to an embodiment, a transistor is provided. The transistor comprises a semiconductor substrate, a gate dielectric layer, a gate electrode, a spacer, and a source/drain. The semiconductor substrate comprises a protrusive semiconductor portion protruded from a lower surface of the semiconductor substrate. The gate dielectric layer is on the semiconductor substrate. The gate electrode is on the gate dielectric layer. The spacer is on a sidewall of the gate electrode. An outer surface of the spacer has a concave portion. The source/drain is in the semiconductor substrate.

According to another embodiment, a method for forming a transistor is provided. The method comprises the following steps. A gate dielectric layer is formed on a semiconductor substrate comprising a protrusive semiconductor portion protruded from a lower surface of the semiconductor substrate. A gate electrode is formed on the gate dielectric layer. A spacer is formed. The spacer is on a sidewall of the gate electrode. An outer surface of the spacer has a concave portion. A source/drain is formed in the semiconductor substrate.

Figure 1:
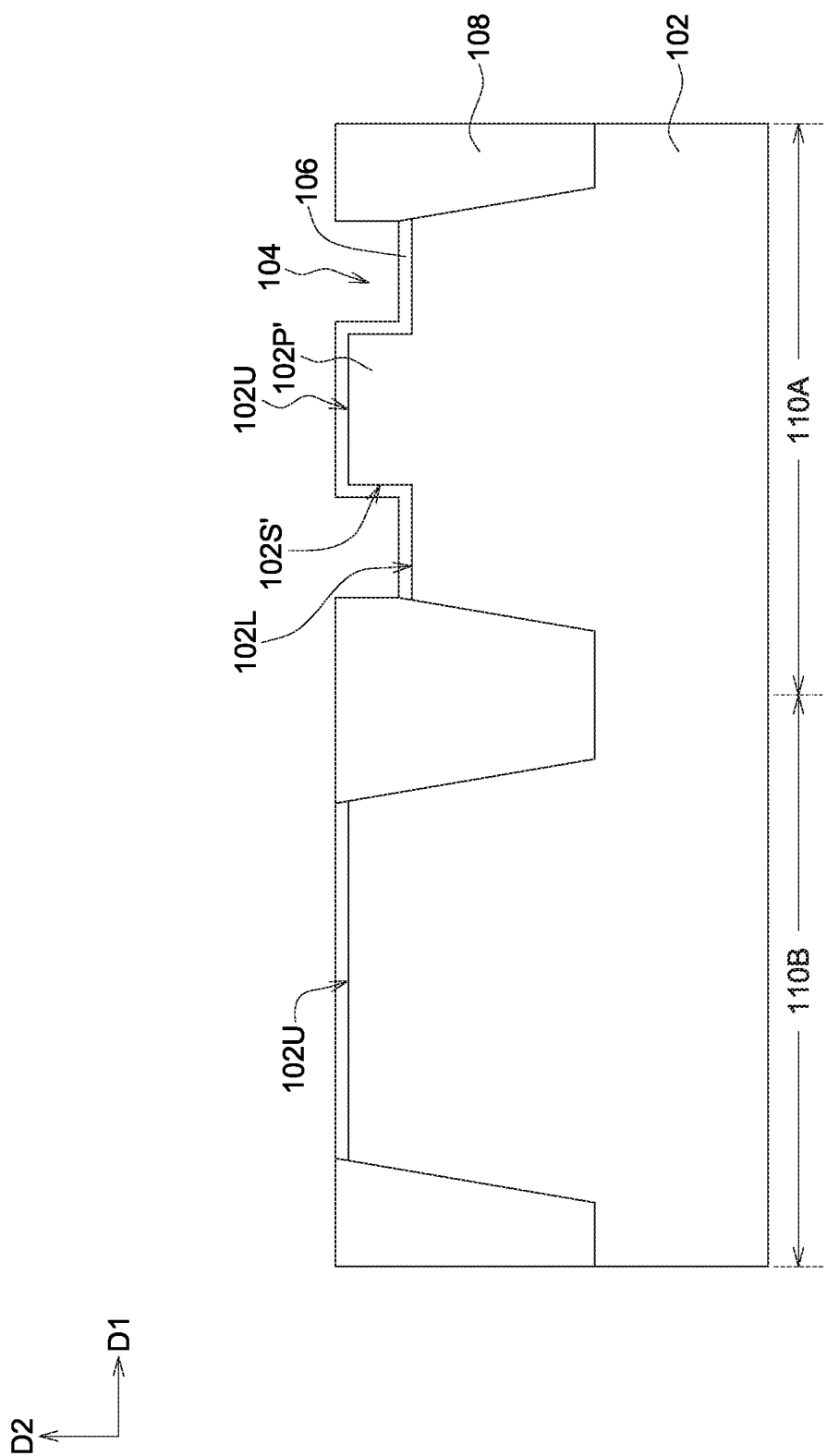
FIG. 1 to FIG. 5 are schematic cross-sectional views of a method of forming a semiconductor device according to an embodiment.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Embodiments are provided hereinafter with reference to the accompanying drawings for describing the related procedures and configurations. It is noted that not all embodiments of the invention are shown. Also, it is noted that there may be other embodiments of the present disclosure which are not specifically illustrated. Modifications and variations can be made without departing from the spirit of the disclosure to meet the requirements of the practical applications. It is also important to point out that the illustrations may not be necessarily drawn to scale. Thus, the specification and the drawings are to be regard as an illustrative sense rather than a restrictive sense. The identical and/or similar elements of the embodiments are designated with the same and/or similar reference numerals.

FIG. 1 to FIG. 5 are shown to illustrate a manufacturing method for forming a semiconductor device according to an embodiment.

Referring to FIG. 1, a semiconductor substrate 102 is provided. The semiconductor substrate 102 may comprise a silicon-containing substrate. The semiconductor substrate 102 has a front surface comprising an upper surface 102U. An etching step may be performed to the semiconductor substrate 102 from the upper surface 102U to form a recess 104 exposing a sidewall surface 102S' and a lower surface 102L below the sidewall surface 102S' of the semiconductor substrate 102. In addition, a protrusive semiconductor portion 102P' may be defined through the etching step. In an embodiment, during the etching step, a patterned mask layer (not shown) formed the upper surface 102U of the semiconductor substrate 102 may be used as an etching mask, and a pattern of the patterned mask layer may be transferred down into the semiconductor substrate 102 so as to form the recess 104. In an embodiment, the patterned mask layer comprises a photoresist formed by a photolithography process, but is not limited thereto. After the etching step, the patterned mask layer (not shown) may be removed. The protrusive semiconductor portion 102P' has the sidewall surface 102S' and the upper surface 102U and is protruded from the lower surface 102L of the semiconductor substrate 102. In this embodiment, the sidewall surface 102S' formed through the etching step for forming the recess 104, the protrusive semiconductor portion 102P' may be a vertical surface perpendicular to the lower surface 102L and the upper surface 102U of the semiconductor substrate 102.

A dielectric film 106 may be formed on the front surface of the semiconductor substrate 102. The front surface comprises the upper surface 102U, the lower surface 102L and the sidewall surface 102S'. The dielectric film 106 includes silicon oxide, and the forming method thereof includes performing an oxidation process or a suitable deposition process, such as a chemical vapor deposition (CVD) process or an atomic layer deposition (ALD) process, and so on. An isolation structure 108 may be formed in the semiconductor substrate 102. Active regions in a region 110A and a region 110B may be defined by the isolation structure 108. In an embodiment, the isolation structure 108 comprises a shallow trench isolation (STI) as shown in figures, but is not limited thereto, and may use other suitable isolation elements.

Figure 2:
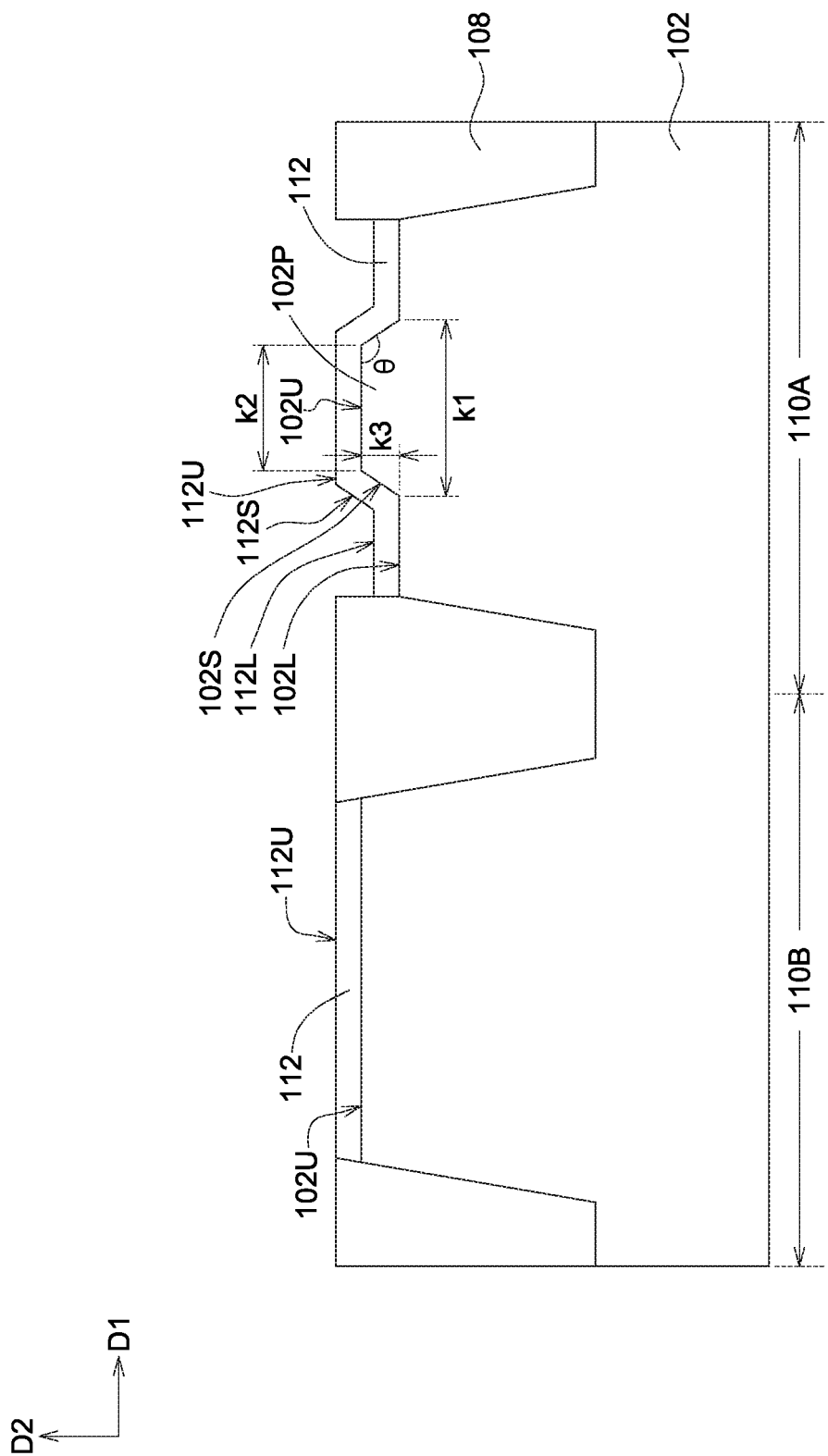

Referring to FIG. 2, a gate dielectric layer 112 is formed on the semiconductor substrate 102. In an embodiment, the gate dielectric layer 112 may be formed by a method comprising a thermal oxidation method which may transform the protrusive semiconductor portion 102P' (FIG. 1) into a protrusive semiconductor portion 102P having a leaned sidewall surface 102S between the upper surface 102U and the lower surface 102L of the semiconductor substrate 102 as shown in FIG. 2. The gate dielectric layer 112 includes silicon oxide.

The leaned sidewall surface 102S of the protrusive semiconductor portion 102P is not perpendicular to the upper surface 102U and the lower surface 102L of the semiconductor substrate 102. For example, an included angle θ between the leaned sidewall surface 102S and the upper surface 102U of the protrusive semiconductor portion 102P may be an obtuse angle of 120 degrees to 150 degrees. In an embodiment, the protrusive semiconductor portion 102P may have a trapezoid shape. For example, the protrusive semiconductor portion 102P has a bottom size k1 (e.g. width) in a first direction D1 and a top size k2 (e.g. width) in the first direction D1. The bottom size k1 is larger than the top size k2. A difference between the bottom size k1 and the top size k2 may be 600 Å to 800 Å. A size k3 (e.g. height) of the protrusive semiconductor portion 102P in a second direction D2 may be 300 Å to 400 Å. The first direction D1 is different from the second direction D2. The first direction D1 may be substantially perpendicular to the second direction D2. For example, the first direction D1 may be parallel to a X axis or a Y axis, and the second direction D2 may be parallel to a Z axis.

In an embodiment, gate dielectric layer 112 may be a conformal film on the front surface of the semiconductor substrate 102. Therefore, the gate dielectric layer 112 in the region 110A may have a surface profile similar to the front surface comprising the leaned sidewall surface 102S, the upper surface 102U and the lower surface 102L of the semiconductor substrate 102 in the region 110A. In other words, the gate dielectric layer 112 in the region 110A may have an upper surface 112U, a lower surface 112L, and a leaned sidewall surface 112S between the upper surface 112U and the lower surface 112L.

Figure 3:
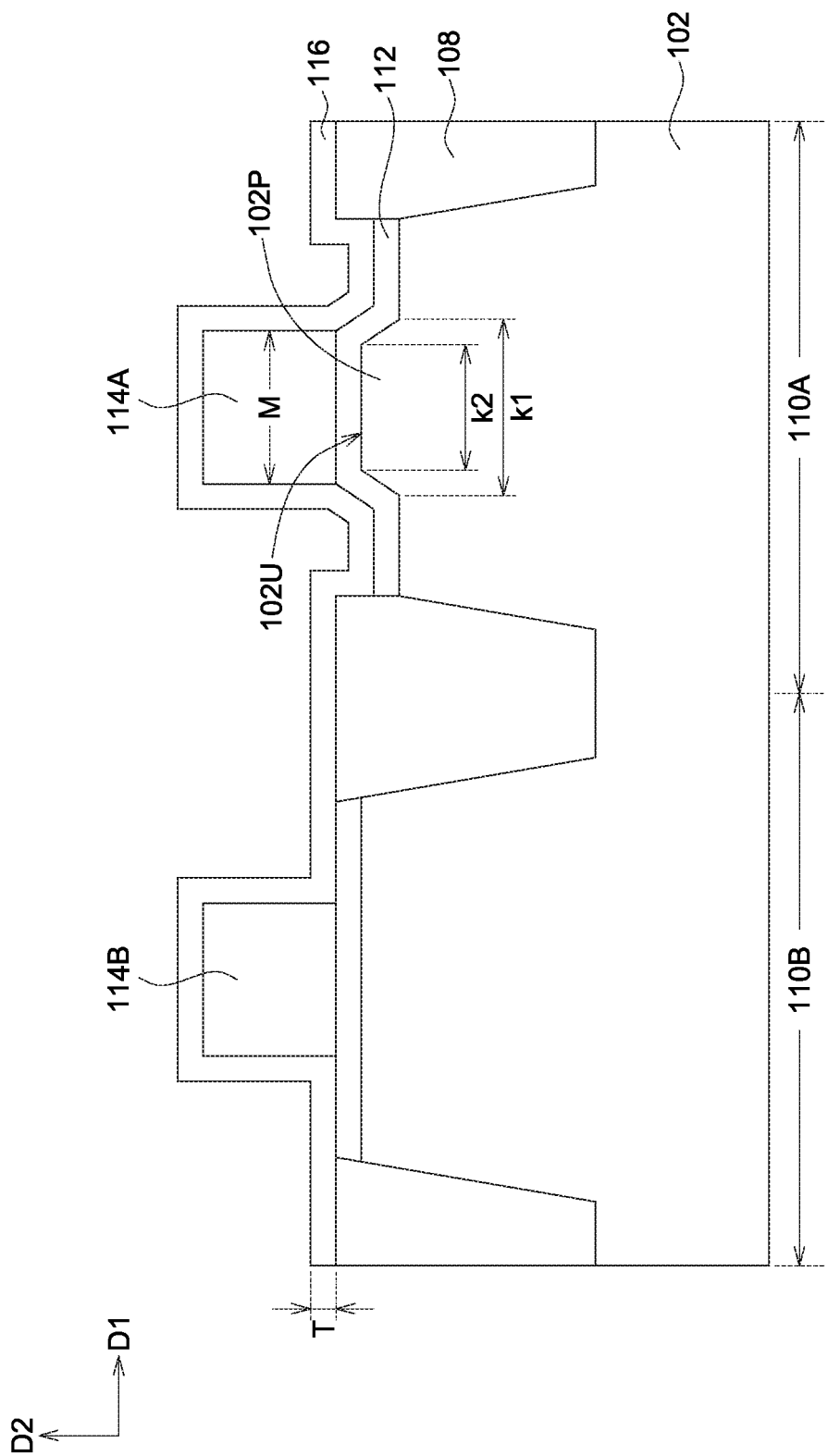

Referring to FIG. 3, a gate electrode 114A and a gate electrode 114B are formed on the gate dielectric layer 112. The gate electrode 114A is formed on the gate dielectric layer 112 on the protrusive semiconductor portion 102P of the semiconductor substrate 102 in the region 110A. The gate electrode 114A may be on the upper surface 102U of the protrusive semiconductor portion 102P. The gate electrode 114B is formed on the gate dielectric layer 112 in the region 110B. The gate electrode 114A and the gate electrode 114B may be formed by a method comprising forming a conductive material layer (not show), including polysilicon, amorphous silicon or a combination thereof, on the structure shown in FIG. 2 by a suitable deposition process, such as a CVD process or an ALD process, and then patterning the conductive material layer by a patterning step including performing photolithography and etching processes.

The gate electrode 114A has a size M in the first direction D1. The bottom size k1 of the protrusive semiconductor portion 102P is larger than the size M of the gate electrode 114A. The size M of the gate electrode 114A may be larger than, equal to, or smaller than the top size k2 of the protrusive semiconductor portion 102P. In an example, a difference between the top size k2 of the protrusive semiconductor portion 102P and the size M of the gate electrode 114A is within 10 nm.

An insulating film 116 may be formed on the gate electrode 114A, the gate electrode 114B, the gate dielectric layer 112, and the isolation structure 108. The insulating film 116 includes silicon nitride, and the forming method thereof includes performing a suitable deposition process, such as a CVD process or an ALD process. In an embodiment, the insulating film 116 may have a thickness T being 320 Å to 380 Å.

Figure 4:
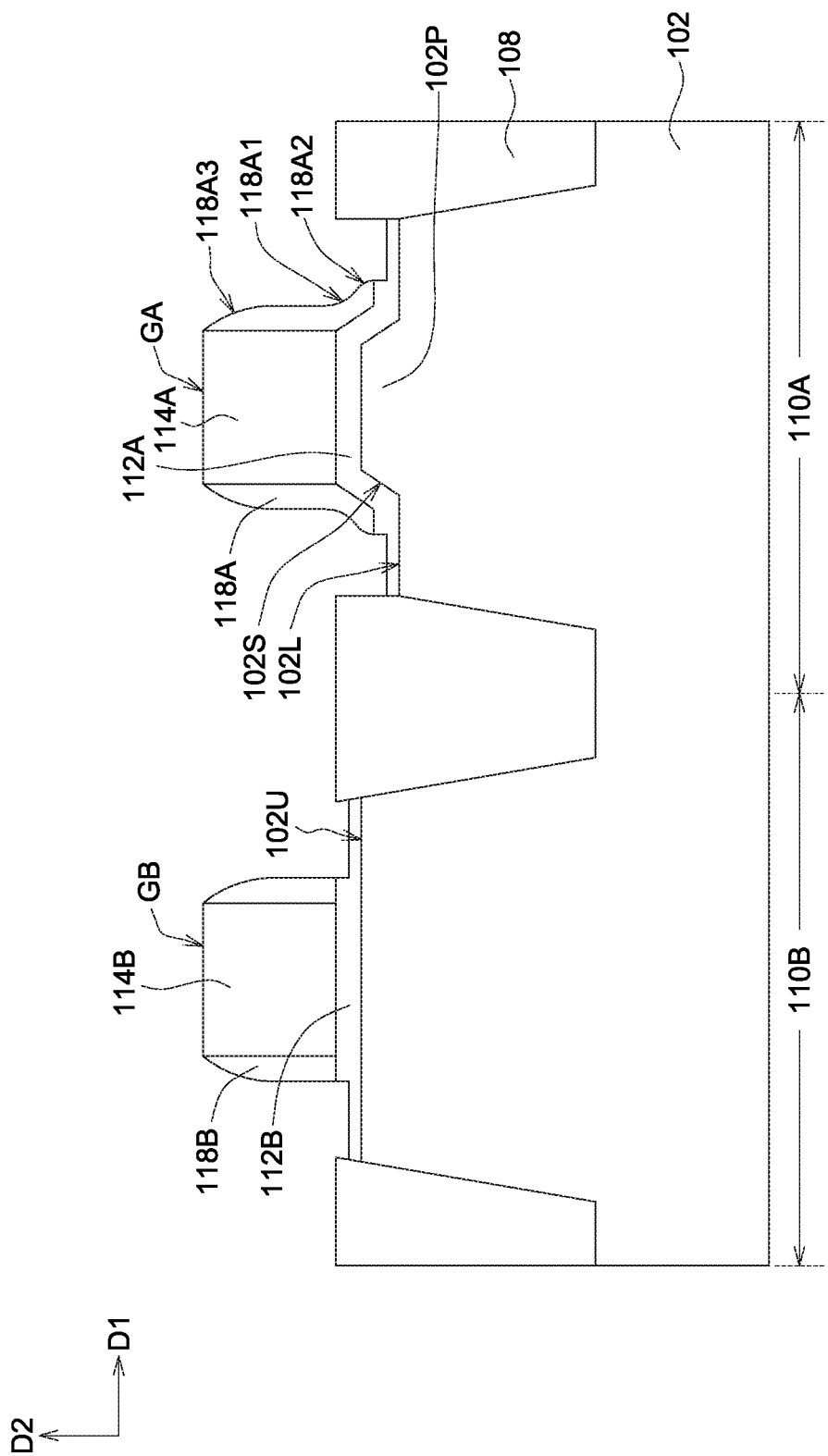

Referring to FIG. 4, an etching step may be performed to remove a portion of the insulating film 116 (FIG. 3), and the remained portion of the insulating film 116 forms a spacer 118A and a spacer 118B. In an embodiment, the etching step may be an anisotropic etching step for the insulating film 116, and the spacer 118A and the spacer 118B are self-aligned spacers formed without using/forming a photo mask layer and/or an addition film stack. The spacer 118A is on a sidewall of the gate electrode 114A and is on the gate dielectric layer 112A on the leaned sidewall surface 102S of the protrusive semiconductor portion 102P and the lower surface 102L of the semiconductor substrate 102. In embodiments, an outer surface of the spacer 118A has a concave portion 118A1. In an embodiment, the outer surface of the spacer 118A may have a double C-shape, for example, comprising the concave portion 118A1 and further comprising a lower convex portion 118A2 and an upper convex portion 118A3. The concave portion 118A1 is between the lower convex portion 118A2 and the upper convex portion 118A3. A portion of the spacer 118A having the lower convex portion 118A2 is on the gate dielectric layer 112A on the leaned sidewall surface 102S of the protrusive semiconductor portion 102P. A portion of the spacer 118A having the upper convex portion 118A3 is on the sidewall of the gate electrode 114A. A gate structure GA in the region 110A comprises the gate dielectric layer 112A, the gate electrode 114A and the spacer 118A. The spacer 118B is on a sidewall of the gate electrode 114B and is on the gate dielectric layer 112B on the upper surface 102U of the semiconductor substrate 102. A gate structure GB in the region 110B comprises the gate dielectric layer 112B, the gate electrode 114B and the spacer 118B.

Figure 5:
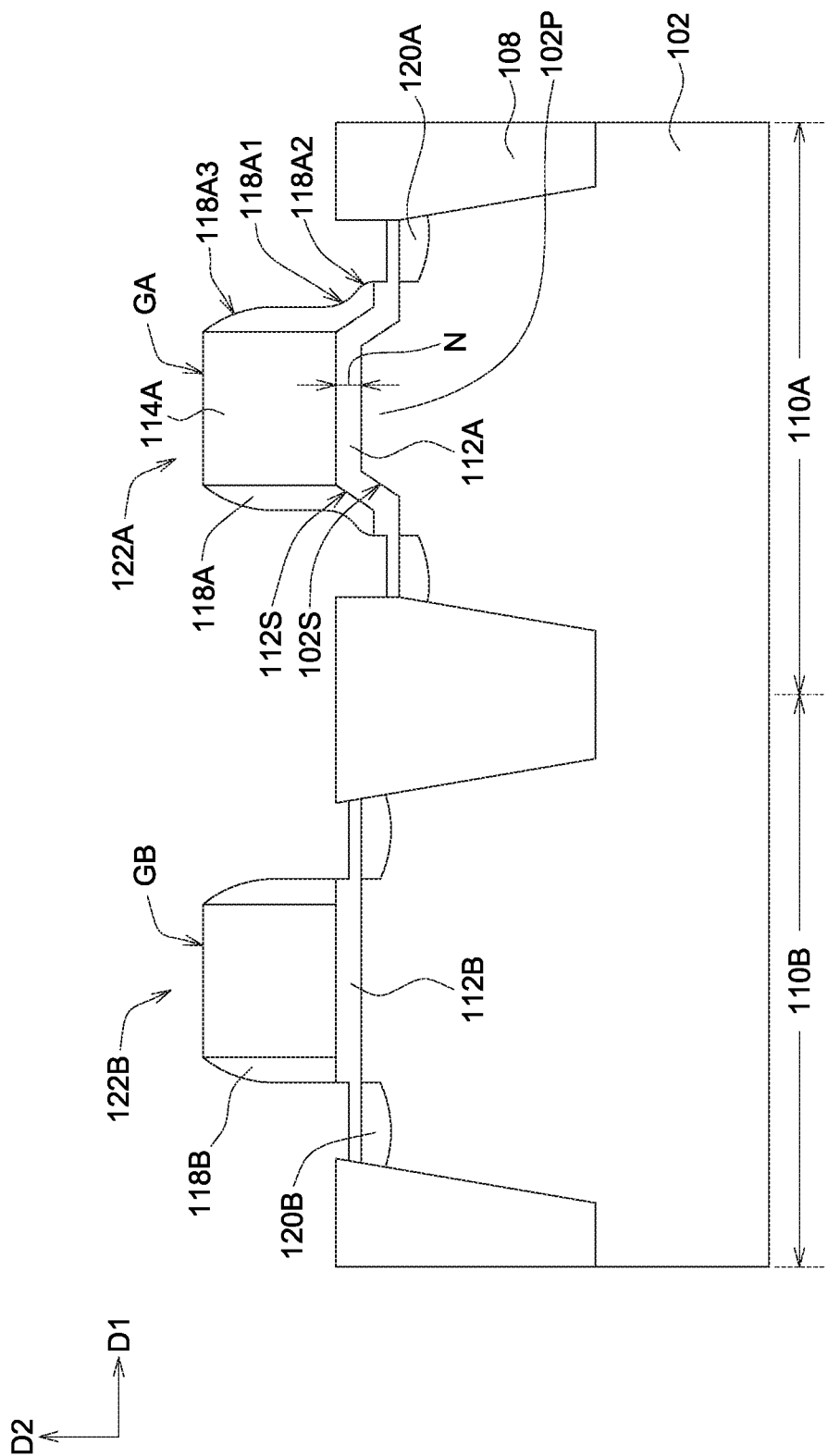

Referring to FIG. 5, a source/drain 120A and a source/drain 120B are formed in the semiconductor substrate 102. The source/drain 120A and the source/drain 120B may be formed by a doping process with using the gate structure GA and the gate structure GB as a doping mask. A transistor 122A comprises the gate structure GA and the source/drain 120A in the region 110A. A transistor 122B comprises the gate structure GB and the source/drain 120B in the region 110B. In an embodiment, for example, the region 110A may be a medium-V device region. The region 110B may be a low-V device region. A thickness N of the gate dielectric layer 112A of the transistor 122A may be larger than a thickness of the gate dielectric layer 112B of the transistor 122B. For example, in an embodiment, the thickness N of the gate dielectric layer 112A of the transistor 122A may be 100 Å to 300 Å.

In the embodiment, the spacer 118A of the transistor 122A has an expanded portion (i.e. the portion having the concave portion 118A1 and the portion having the lower convex portion 118A2) on the leaned surface sidewall (i.e. the leaned sidewall surface 112S of the gate dielectric layer 112A and the leaned sidewall surface 102S of the protrusive semiconductor portion 102P) beyond the sidewall of the gate electrode 114A. Therefore, the spacer 118A has an increased spacer width with the expanded portion. In such manner, the GIDL and hot carrier effect of the transistor 122A can be reduced.

The semiconductor device as shown in FIG. 5 is not limited to be manufactured through the above method.

Figure 6:
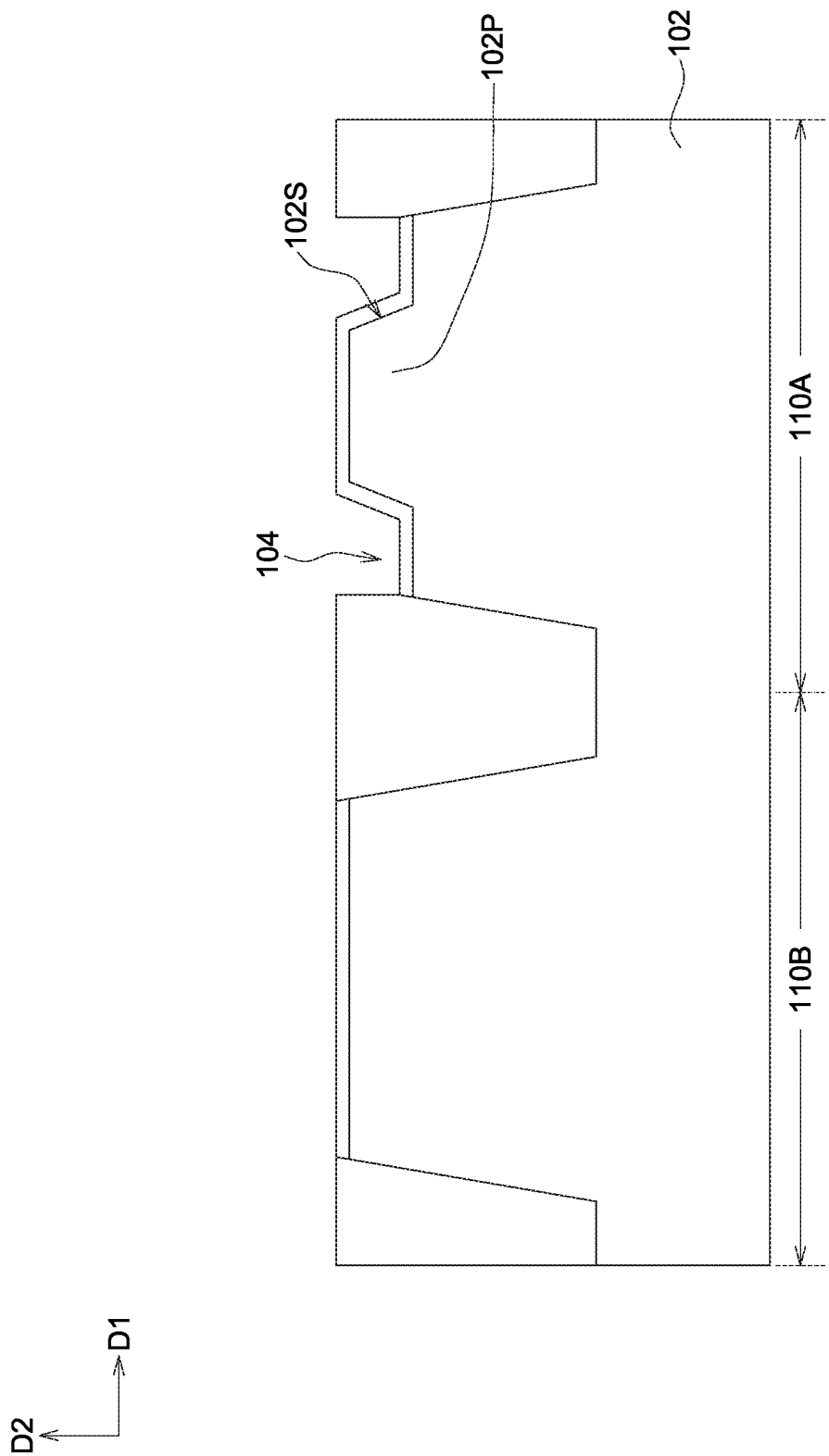
FIG. 6 is a schematic cross-sectional view of a step for a method of forming a semiconductor device according to another embodiment.

For example, the manufacturing step shown in FIG. 1 may be replaced by a manufacturing step shown in FIG. 6. Referring to FIG. 6, in another embodiment, the leaned sidewall surface 102S of the protrusive semiconductor portion 102P may be formed through the etching step performed to the semiconductor substrate 102 for forming the recess 104/protrusive semiconductor portion 102P before forming a gate dielectric layer (for example the gate dielectric layer 112 illustrated referring to FIG. 2).

Figure 7:
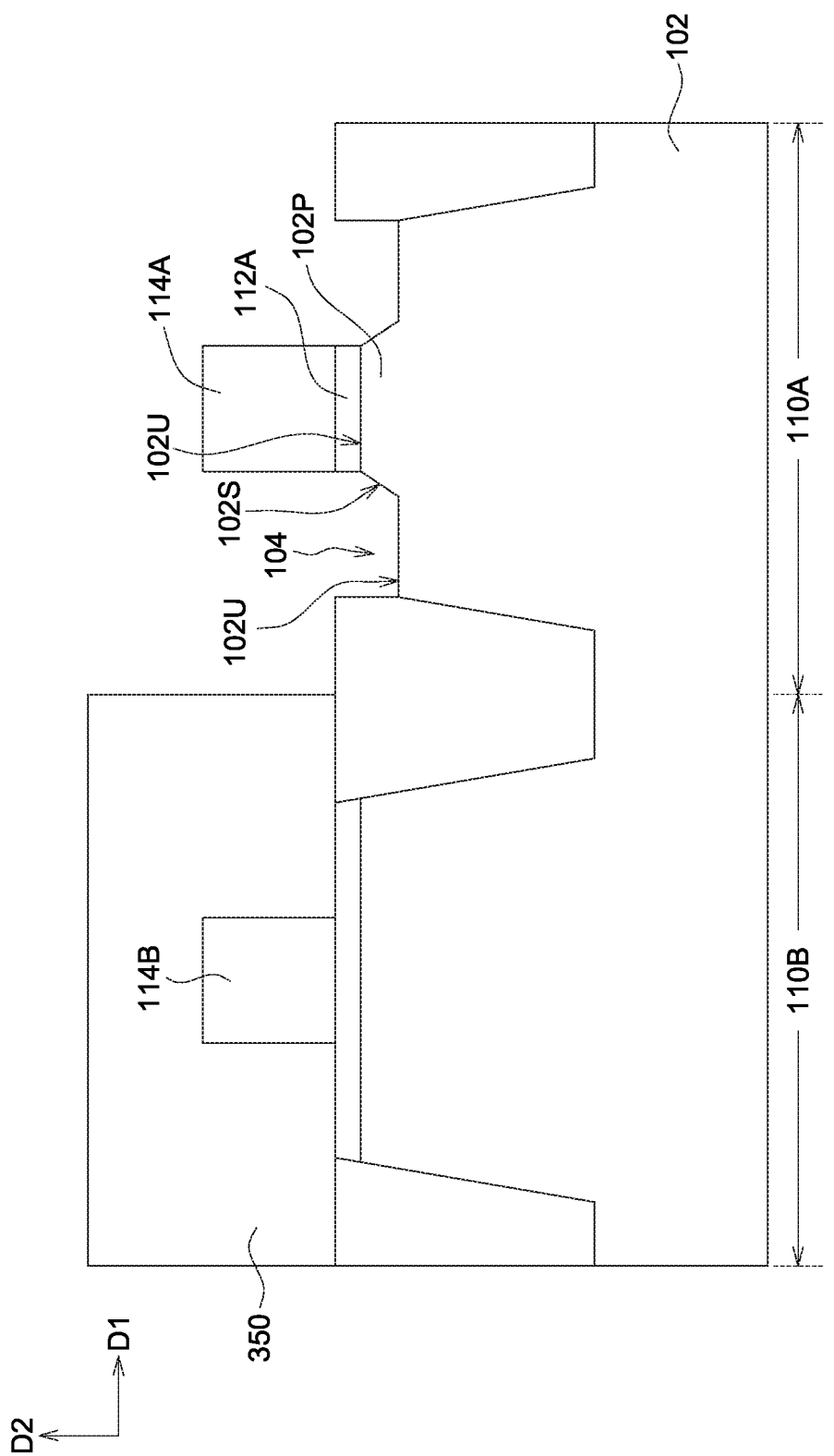
FIG. 7 to FIG. 9 are schematic cross-sectional views of a method of forming a semiconductor device according to yet another embodiment.
Figure 8:
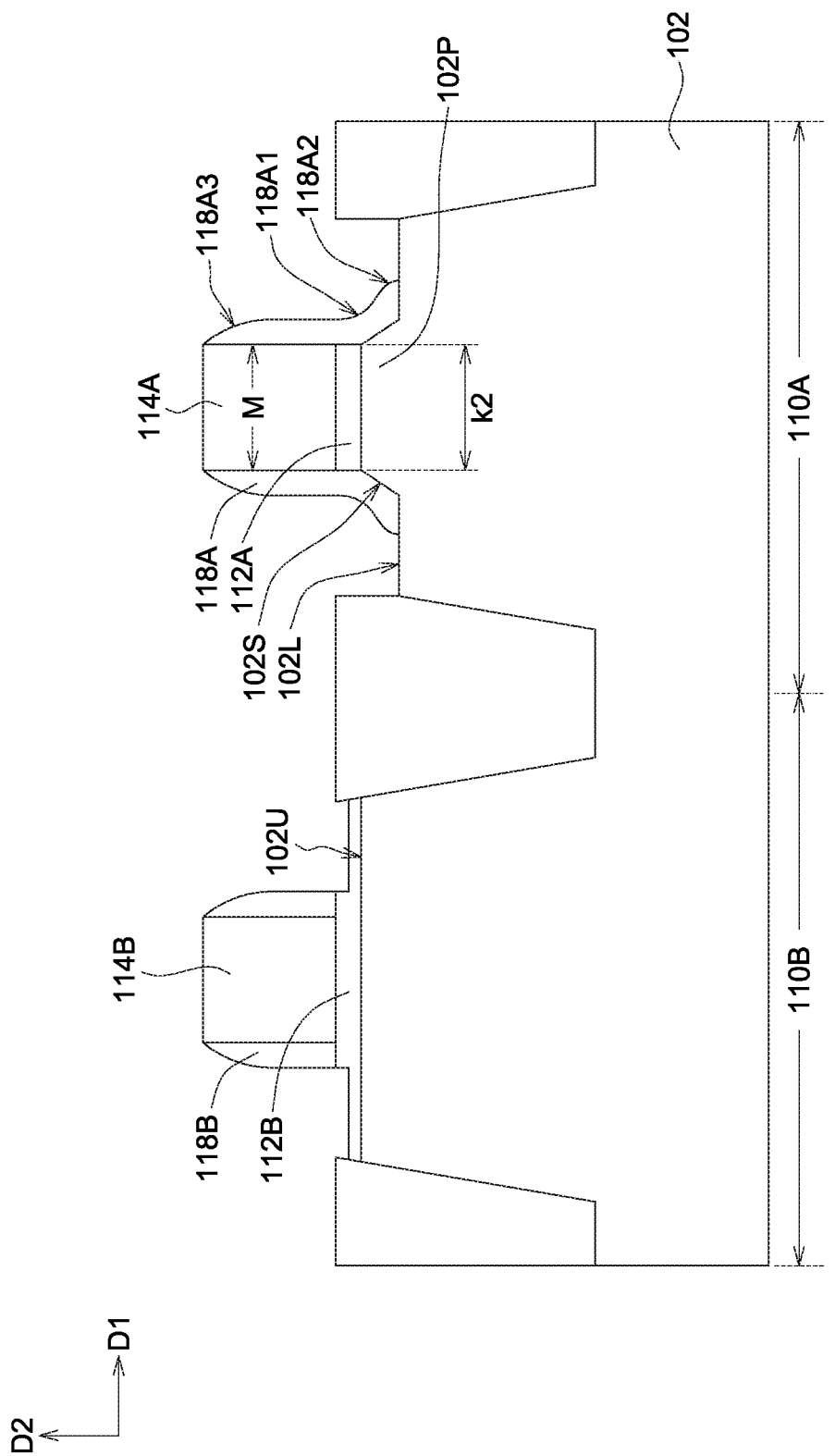
Figure 9:
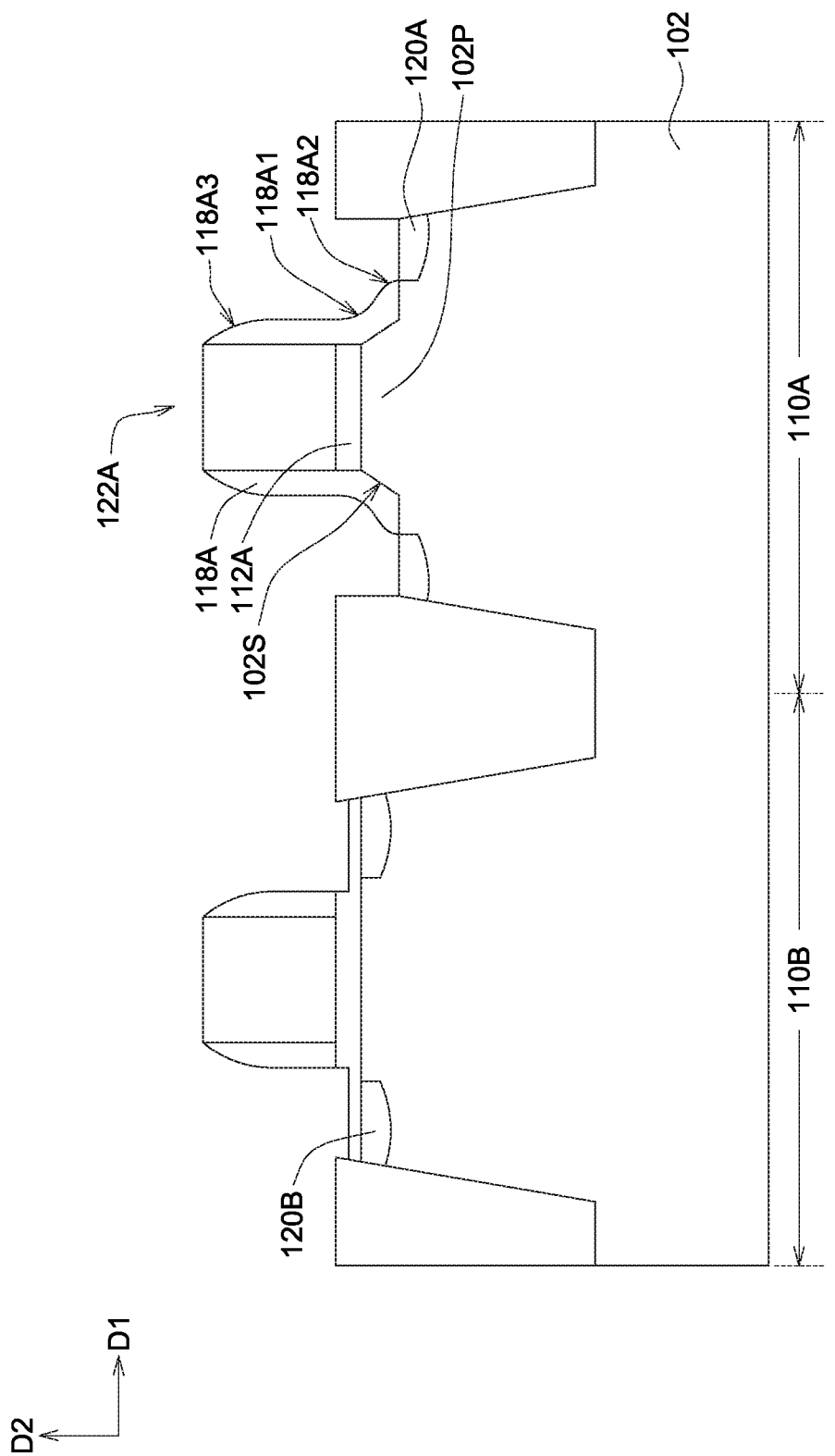

FIG. 7 to FIG. 9 are shown to illustrate a manufacturing method for forming a semiconductor device according to yet another embodiment.

Referring to FIG. 7, a gate dielectric layer (for example similar to the gate dielectric layer 112 illustrated with referring to FIG. 2) may be formed on the upper surface 102U of the semiconductor substrate 102. The gate electrode 114A and the gate electrode 114B are formed on the gate dielectric layer. A patterned mask layer 350 may be formed to cover the structure in the region 110B. An etching step may be performed to remove portions of the gate dielectric layer and the semiconductor substrate 102 not covered by the gate electrode 114A and the patterned mask layer 350 functioning as an etching mask. In particular, the etching step removes the gate dielectric layer and then removes the semiconductor substrate 102 from the upper surface 102U to form the recess 104 exposing the leaned sidewall surface 102S and the lower surface 102L of the semiconductor substrate 102 and form the protrusive semiconductor portion 102P in the region 110A. The remained portion of the gate dielectric layer in the region 110A forms the gate dielectric layer 112A.

Referring to FIG. 8, the spacer 118A is formed on the sidewall of the gate electrode 114A, a sidewall of the gate dielectric layer 112A, the leaned sidewall surface 102S of the protrusive semiconductor portion 102P and the lower surface 102L of the semiconductor substrate 102. In particular, since the gate dielectric layer 112A not covered by the gate electrode 114A in the region 110A is removed, the spacer 118A is formed to be in contact with the sidewall of the gate dielectric layer 112A, the leaned sidewall surface 102S of the protrusive semiconductor portion 102P, and the lower surface 102L of the semiconductor substrate 102. The spacer 118B is formed on the sidewall of the gate electrode 114B and the gate dielectric layer 112B on the upper surface 102U of the semiconductor substrate 102. The spacer 118A and the spacer 1188 may be formed by a method comprising forming an insulating film by a deposition method and then performing an anisotropic etching step to the insulation film, similar to the illustration relative to the process performed to the insulating film 116 referring to FIG. 3 and FIG. 4.

The semiconductor structure shown in FIG. 8 may be different from the semiconductor structure shown in FIG. 4 with the following illustration. Portions of the spacer 118A having the concave portion 118A1 and the lower convex portion 118A2 is on the sidewall of the gate dielectric layer 112A and the leaned sidewall surface 102S of the protrusive semiconductor portion 102P. In particular, the portion of the spacer 118A having the concave portion 118A1 is in contact with the leaned sidewall surface 102S of the protrusive semiconductor portion 102P, and the lower surface 102L of the semiconductor substrate 102. The size M of the gate electrode 114A may be substantially equal to top size k2 of the protrusive semiconductor portion 102P.

Referring to FIG. 9, the source/drain 120A and the source/drain 1208 are formed in the semiconductor substrate 102.

In the embodiment, the spacer 118A of the transistor 122A has an expanded portion (i.e. the portion having the concave portion 118A1 and the portion having the lower convex portion 118A2) on the leaned sidewall surface 102S of the protrusive semiconductor portion 102P beyond the sidewalls of the gate electrode 114A and the gate dielectric layer 112A. Therefore, the spacer 118A has an increased spacer width with the expanded portion. In such manner, the GIDL and hot carrier effect of the transistor 122A can be alleviated.

In summary, in the present invention, the transistor 122A has the spacer 118A having an expanded portion (i.e. the portion with the outer surface having the concave portion 118A1 and/or the portion with the outer surface having the lower convex portion 118A2) on the leaned surface sidewall (i.e. the leaned sidewall surface 112S of the gate dielectric layer 112A and/or the leaned sidewall surface 102S of the protrusive semiconductor portion 102P) beyond the sidewall of the gate electrode 114A. Therefore, the spacer 118A has an increased spacer width with the expanded portion. In such manner, the GIDL and hot carrier effect of the transistor 122A can be reduced. The spacer 118A may be a self-aligned spacer formed without using/forming a photo mask layer and/or an addition film stack.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A transistor, comprising:
    a semiconductor substrate comprising a protrusive semiconductor portion protruded from a lower surface of the semiconductor substrate, wherein the protrusive semiconductor portion comprises an upper surface and a leaned sidewall surface between the upper surface and the lower surface;
    a gate dielectric layer on the semiconductor substrate;
    a gate electrode on the gate dielectric layer;
    a spacer on a sidewall of the gate electrode, wherein an outer surface of the spacer has a concave portion, the spacer has a top end in contact with only the sidewall of the gate electrode, the spacer has a thickness gradually enlarged from the top end of the spacer, wherein the gate dielectric layer is between the spacer and the leaned sidewall surface of the protrusive semiconductor portion, and is between the spacer and the lower surface of the semiconductor substrate, and wherein a material of the gate dielectric layer is different from that of the spacer; and
    a source/drain in the semiconductor substrate.

2. The transistor according to claim 1, wherein the outer surface of the spacer has an upper convex portion and a lower convex portion, wherein the concave portion is between the upper convex portion and the lower convex portion.

3. The transistor according to claim 2, wherein the upper convex portion of the spacer is on the sidewall of the gate electrode.

4. The transistor according to claim 2, wherein the lower convex portion of the spacer is on a sidewall surface of the semiconductor substrate.

5. The transistor according to claim 1, wherein the gate electrode is on the upper surface of the semiconductor substrate.

6. The transistor according to claim 1, wherein the protrusive semiconductor portion has a bottom size of a first direction larger than a size of the gate electrode in the first direction.

7. The transistor according to claim 6, wherein the protrusive semiconductor portion has a top size of the first direction, a difference between the top size of the protrusive semiconductor portion and the size of the gate electrode is within 10 nm.

8. The transistor according to claim 1, wherein the protrusive semiconductor portion has a bottom size of a first direction larger than a top size of the protrusive semiconductor portion in the first direction.

9. The transistor according to claim 8, wherein a difference between the bottom size and the top size is 600 Å to 800 Å.

10. The transistor according to claim 1, wherein the leaned sidewall surface is not perpendicular to the upper surface and the lower surface.

11. The transistor according to claim 10, wherein an included angle between the leaned sidewall surface and the upper surface of the protrusive semiconductor portion is 120 degrees to 150 degrees.

12. The transistor according to claim 1, wherein the gate dielectric layer has a thickness of 100 Å to 300 Å.

13. The transistor according to claim 1, wherein a size of the protrusive semiconductor portion in a second direction is 300 Å to 400 Å.

14. The transistor according to claim 1, wherein the protrusive semiconductor portion has a trapezoid shape.

15. A method for forming a transistor, comprising:
forming a semiconductor substrate comprising a protrusive semiconductor portion protruded from a lower surface of the semiconductor substrate, wherein the protrusive semiconductor portion comprises an upper surface and a leaned sidewall surface between the upper surface and the lower surface;
forming a gate dielectric layer on the semiconductor substrate;
forming a gate electrode on the gate dielectric layer;
forming a spacer, wherein the spacer is on a sidewall of the gate electrode, an outer surface of the spacer has a concave portion, the spacer has a top end in contact with only the sidewall of the gate electrode, the spacer has a thickness gradually enlarged from the top end of the spacer, wherein the gate dielectric layer is between the spacer and the leaned sidewall surface of the protrusive semiconductor portion, and is between the spacer and the lower surface of the semiconductor substrate, and wherein a material of the gate dielectric layer is different from that of the spacer; and
forming a source/drain in the semiconductor substrate.

16. The method for forming the transistor according to claim 15, wherein the semiconductor substrate is formed by a method comprising etching the semiconductor substrate from the upper surface of the semiconductor substrate to form the protrusive semiconductor portion, wherein the gate dielectric layer is formed on the protrusive semiconductor portion,
the forming the spacer comprises:
forming an insulating film on the gate electrode and the gate dielectric layer on the protrusive semiconductor portion; and
performing an anisotropic etching to the insulating film.

17. The method for forming the transistor according to claim 16, wherein the insulating film has a thickness of 320 Å to 380 Å.

* * * * *